United States Patent
Chen et al.

(10) Patent No.: US 10,962,025 B2
(45) Date of Patent: Mar. 30, 2021

(54) FRAME STRUCTURE, FAN AND MOTOR

(71) Applicant: DELTA ELECTRONICS, INC., Taoyuan (TW)

(72) Inventors: Kun-Hung Chen, Taoyuan (TW); Pao-Hung Tung, Taoyuan (TW); Tsung-Yu Lei, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 16/131,778

(22) Filed: Sep. 14, 2018

(65) Prior Publication Data

US 2019/0128287 A1    May 2, 2019

(30) Foreign Application Priority Data

Oct. 27, 2017 (CN) .......................... 201711027644.X

(51) Int. Cl.
*F04D 29/66* (2006.01)

(52) U.S. Cl.
CPC ......... *F04D 29/668* (2013.01); *F04D 29/661* (2013.01)

(58) Field of Classification Search
CPC ............... F04D 29/661; F04D 29/668
See application file for complete search history.

(56) References Cited

U.S. PATENT DOCUMENTS 9,885,276 B2 *    2/2018    Shieh ...................... F01P 11/14

FOREIGN PATENT DOCUMENTS

| CN | 101332585 A | 12/2008 |
|----|-------------|---------|
| CN | 206329517 U | 7/2017  |

\* cited by examiner

*Primary Examiner* — Christopher Verdier
*Assistant Examiner* — Sabbir Hasan
(74) *Attorney, Agent, or Firm* — Muncy, Geissler, Olds & Lowe, P.C.

(57) ABSTRACT

A frame structure includes a frame body and at least one vibration absorbing structure. The vibration absorbing structure has a support column and at least one cantilever. The cantilever has a cantilever body, a first end portion and a second end portion. One end of the support column is connected to a wall surface of the frame body. The first end portion of the cantilever is connected to the support column. The cantilever body and the second end portion extend outwardly and swing freely on the wall surface of the frame body. When the cantilever body and the second end portion are swinging, they are not in contact with any peripheral member and the frame structure.

7 Claims, 9 Drawing Sheets

FRAME STRUCTURE, FAN AND MOTOR

CROSS REFERENCE TO RELATED APPLICATIONS

This Non-provisional application claims priority under 35 U.S.C. § 119(a) on Patent Application No(s). 201711027644.X filed in People's Republic of China on Oct. 27, 2017, the entire contents of which are hereby incorporated by reference.

BACKGROUND OF THE INVENTION

Field of Invention

The disclosure relates to a frame structure, a fan and a motor, which includes a vibration absorbing structure.

Related Art

The fan is usually configured in an electric device for speeding the heat dissipation and achieving a higher heat dissipation efficiency. In general, the faster the rotation speed of the fan is, the higher the vibration frequency is induced. However, the generated vibration during the high-speed rotation of the fan can be delivered to the peripheral devices of the fan, which can influence the performance of the fan assembly system. In particularly, when the vibration frequency is approaching to the natural frequency of the frame structure, the fan will generate a serious resonance, which can affect the lifetime of the fan body and damage the peripheral devices.

In general, the frame structure is designed to provide the damping function by improving structural rigidity or adding buffering material. To improving the structural rigidity, the frame structure can be manufactured by a metal material with higher rigidity, or the geometrical shape of the frame structure can be modified, thereby increasing the structural rigidity and effectively reducing the vibration of the operating fan. However, the above-mentioned methods for providing the damping function will increase the weight of the frame structure. Besides, the metal material has a great delivery rate in resonance. Thus, when the vibration frequency is approaching to the natural frequency of the frame structure, the generated resonance vibration will be greater than the conventional frame structure with lower rigidity and original shape.

In addition, the other method is to add the buffering material at the junction between the vibration source and the internal portion of the frame structure, or between the fan and the base. However, the buffering material will become aged and deterioration after a certain of time, and it will have a greater deformation under the environment of high temperature and heavy loading, which may affect the reliability of the high-speed rotation fan. Therefore, it is an important subject to design a frame structure for solving the problems of fan vibration and resonance.

SUMMARY OF THE INVENTION

In view of the foregoing, an objective of this disclosure is to provide a frame structure, a fan and a motor having at least one vibration absorbing structure, which can generate a motion in a reverse phase of the set structure for absorbing the vibration of the structure, thereby achieving an effective damping effect.

To achieve the above, a frame structure of the disclosure includes a frame body and at least one vibration absorbing structure. The vibration absorbing structure includes a support column and at least one cantilever. The cantilever includes a cantilever body, a first end portion and a second end portion. One end of the support column is connected to a wall surface of the frame body. The first end portion of the cantilever is connected to the support column. The cantilever body and the second end portion extend outwardly and swing freely on the wall surface of the frame body. When the cantilever body and the second end portion are swinging, the cantilever body and the second end portion are not in contact with a peripheral member and the frame structure.

In one embodiment, the cantilever is a flat plate structure, a folded plate structure, a curved plate structure, a wavy plate structure, a column structure, a curved column structure, a circular disc structure, a wing structure, or an irregular structure.

In one embodiment, the number of the cantilever is two or more than two, and the cantilever do not contact with another one.

In one embodiment, the support column and the cantilever are structures made of different materials.

In one embodiment, the cantilever further includes at least one secondary arm. One end of the secondary arm is connected to the cantilever, and the other end of the secondary arm extends outwardly.

In one embodiment, the frame body has at least one accommodating space sunk from at least one surface of the frame body, the vibration absorbing structure is disposed in the accommodating space, the end of the support column is connected to the wall surface of the frame body, and when the cantilever body and the second end portion are swinging, the cantilever body and the second end portion are not in contact with the wall surface of the frame structure.

In one embodiment, the cantilever is formed by a plurality sections made of different materials.

In addition, the disclosure also provides a fan including an impeller, a driving device, a supporting element and at least one vibration absorbing structure. The driving device drives the impeller to rotate, and the supporting element carries the driving device. The vibration absorbing structure includes a support column and at least one cantilever. The cantilever includes a cantilever body, a first end portion and a second end portion. One end of the support column is connected to a wall surface of the supporting element. The first end portion of the cantilever is connected to the support column. The cantilever body and the second end portion extend outwardly and swing freely on the wall surface of the supporting element. When the cantilever body and the second end portion are swinging, the cantilever body and the second end portion are not in contact with a peripheral member and the supporting element.

In one embodiment, the supporting element further includes a base, and the vibration absorbing structure is disposed on at least one wall surface of the base.

In one embodiment, the supporting element further includes a frame, and the vibration absorbing structure is disposed on at least one wall surface of the frame.

In one embodiment, the cantilever is a flat plate structure, a folded plate structure, a curved plate structure, a wavy plate structure, a column structure, a curved column structure, a circular disc structure, a wing structure, or an irregular structure.

In one embodiment, the number of the cantilever is two or more than two, and the cantilever do not contact with another one.

In one embodiment, the support column and the cantilever are structures made of different materials.

In one embodiment, the cantilever further includes at least one secondary arm. One end of the secondary arm is connected to the cantilever, and the other end of the secondary arm extends outwardly.

In one embodiment, the supporting element has at least one accommodating space sunk from at least one surface of the supporting element, the vibration absorbing structure is disposed in the accommodating space, the end of the support column is connected to the wall surface of the supporting element, and when the cantilever body and the second end portion are swinging, the cantilever body and the second end portion are not in contact with the wall surface of the supporting element.

This disclosure further provides a motor including a driving device, a housing and at least one vibration absorbing structure. The driving device is disposed in the housing. The vibration absorbing structure includes a support column and at least one cantilever. The cantilever includes a cantilever body, a first end portion and a second end portion. One end of the support column is connected to a wall surface of the housing. The first end portion of the cantilever is connected to the support column. The cantilever body and the second end portion extend outwardly and swing freely on the wall surface of the housing. When the cantilever body and the second end portion are swinging, the cantilever body and the second end portion are not in contact with a peripheral member and the housing.

In one embodiment, the cantilever is a flat plate structure, a folded plate structure, a curved plate structure, a wavy plate structure, a column structure, a curved column structure, a circular disc structure, a wing structure, or an irregular structure.

In one embodiment, the number of the cantilever is two or more than two, and the cantilever do not contact with another one.

In one embodiment, the support column and the cantilever are structures made of different materials.

In one embodiment, the cantilever further includes at least one secondary arm. One end of the secondary arm is connected to the cantilever, and the other end of the secondary arm extends outwardly.

In one embodiment, the housing has at least one accommodating space sunk from at least one surface of the housing, the vibration absorbing structure is disposed in the accommodating space, the end of the support column is connected to the wall surface of the housing, and when the cantilever body and the second end portion are swinging, the cantilever body and the second end portion are not in contact with the wall surface of the housing.

As mentioned above, the frame structure, fan and motor of this disclosure are configured with at least one vibration absorbing structure for absorbing the generated vibration. When the frame structure, fan and motor generate resonance, the cantilever body and the second end of the vibration absorbing structure can swing freely on the set structure and are not in contact with the peripheral members. In this case, the generated swing is a motion in a reverse phase of the set structure, so that the vibration absorbing structure can compensate and absorb the vibration of the structure, thereby achieving the effective damping effect.

The vibration absorbing structure can be installed on the outer surface of the frame body, the supporting element of the fan, and the housing of the motor. Furthermore, the vibration absorbing structure can be disposed in the accommodating space sunk from the surface of the structure. This design of the vibration absorbing structure will not increase the total volume of the entire set structure, can keep the smooth surface of the set structure, and does not influence the spatial configuration of the entire system.

In addition, the configuration of the vibration structure can eliminate the vibration of a certain bandwidth. The shape and amount of the cantilevers can increase the absorbed vibration bandwidth. The configuration of the support column can improve the motion stability of the cantilevers. These configurations can achieve an effective damping effect, increase the lifetime of the fan and motor, and enhance the performance of the entire system.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
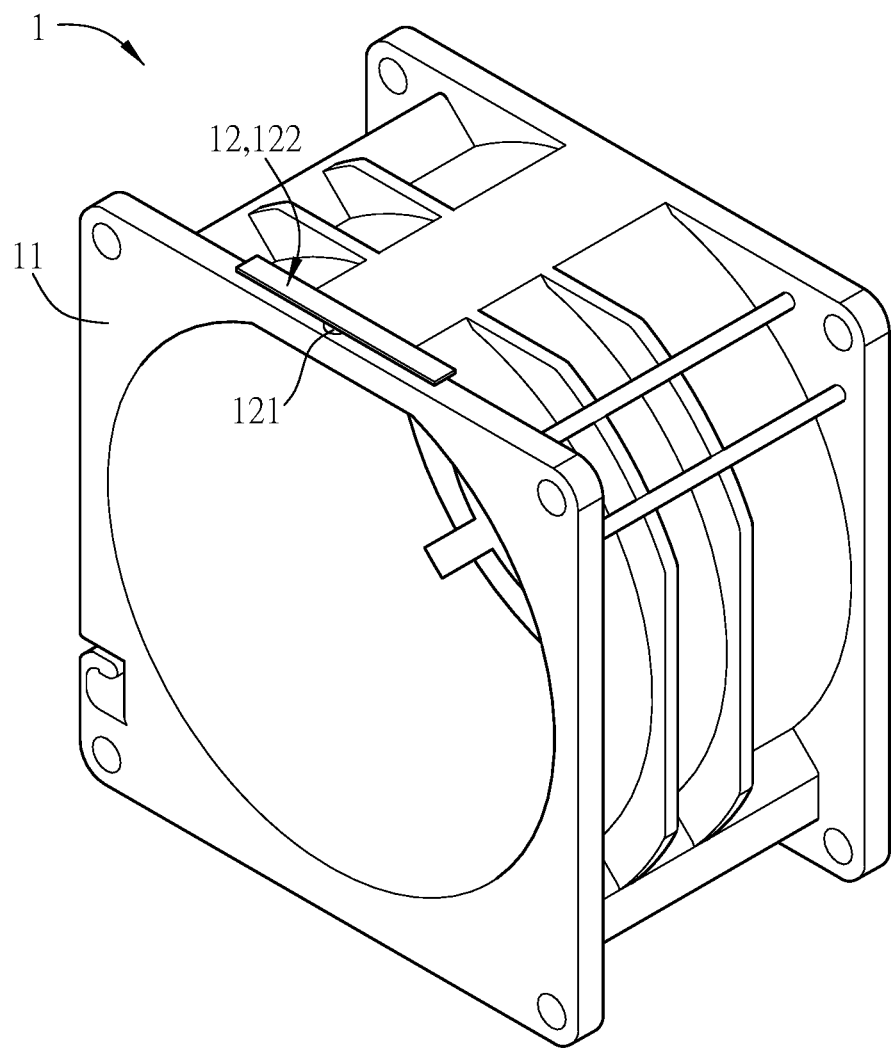
FIG. 1A is a schematic diagram showing a frame structure according to an embodiment of the disclosure.
Figure 1B:
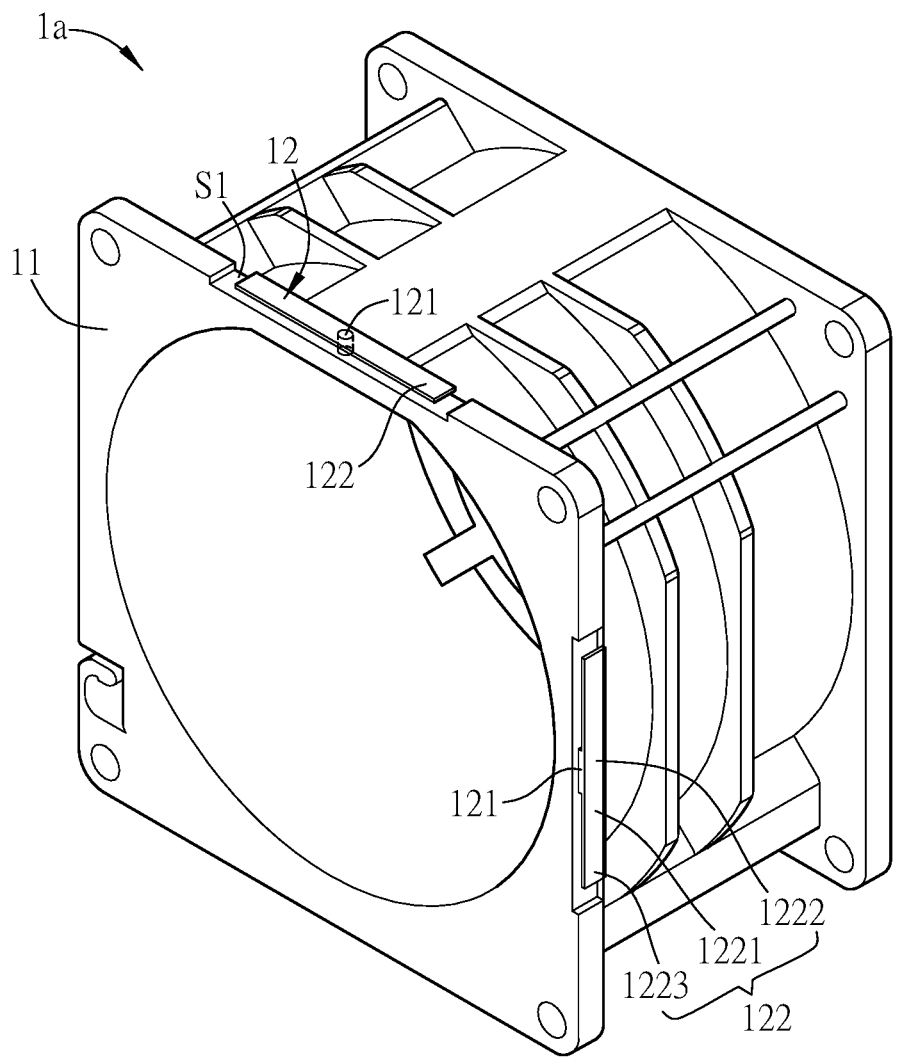
FIG. 1B is a schematic diagram showing a frame structure according to another embodiment of the disclosure.
Figure 2A:
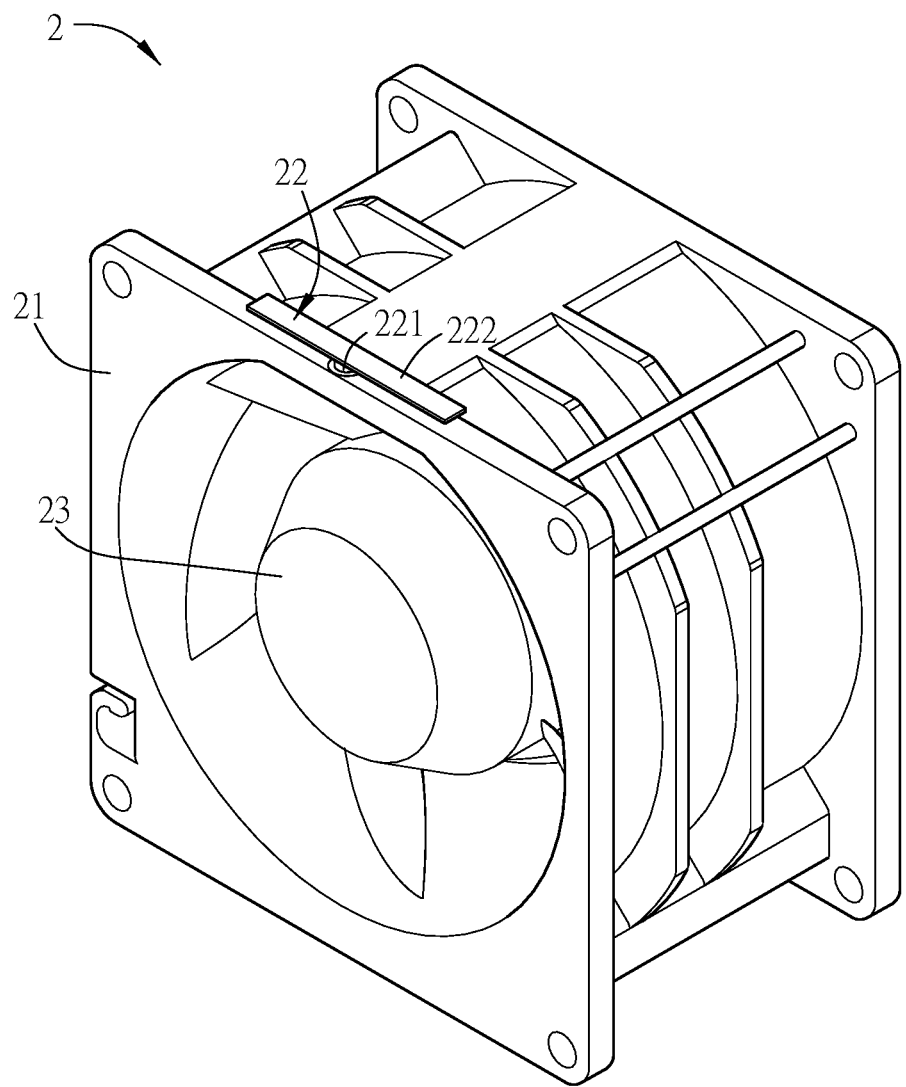
FIG. 2A is a schematic diagram showing a fan according to an embodiment of the disclosure.
Figure 2B:
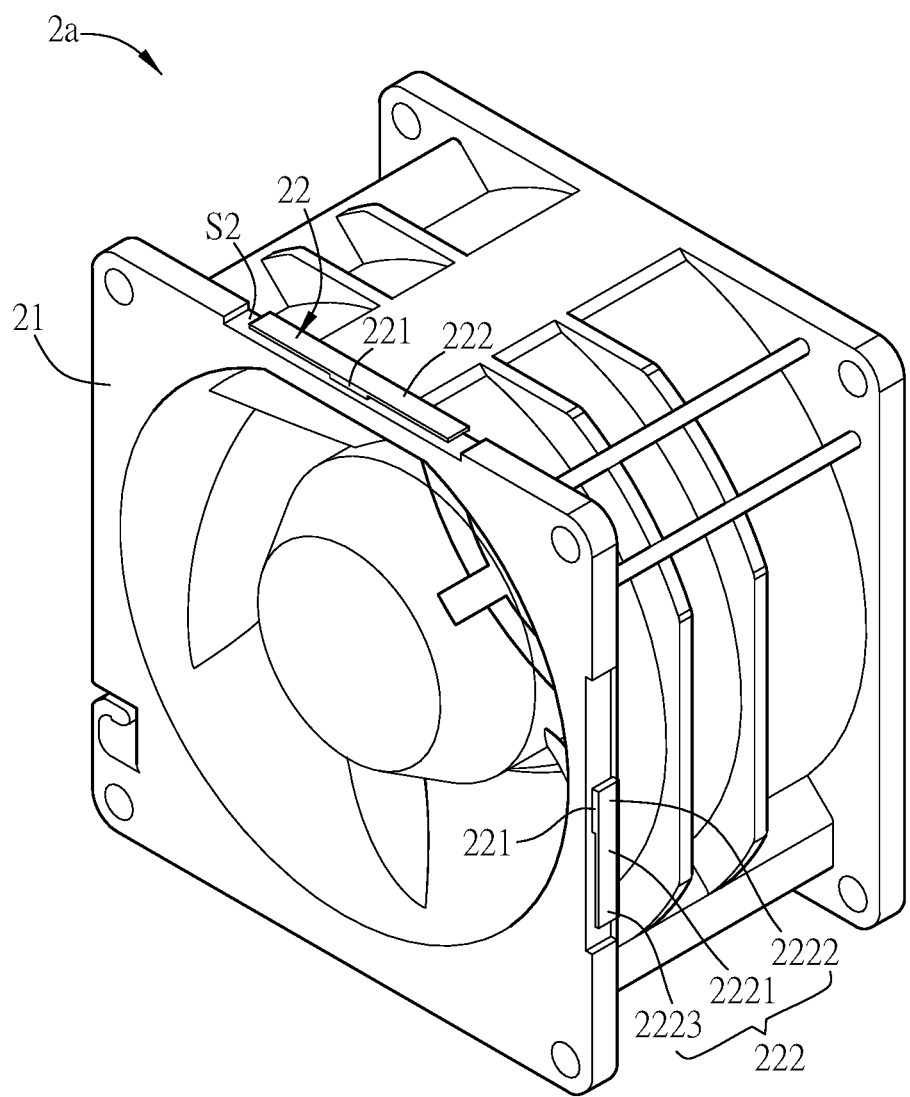
FIG. 2B is a schematic diagram showing a fan according to another embodiment of the disclosure.
Figure 2C:
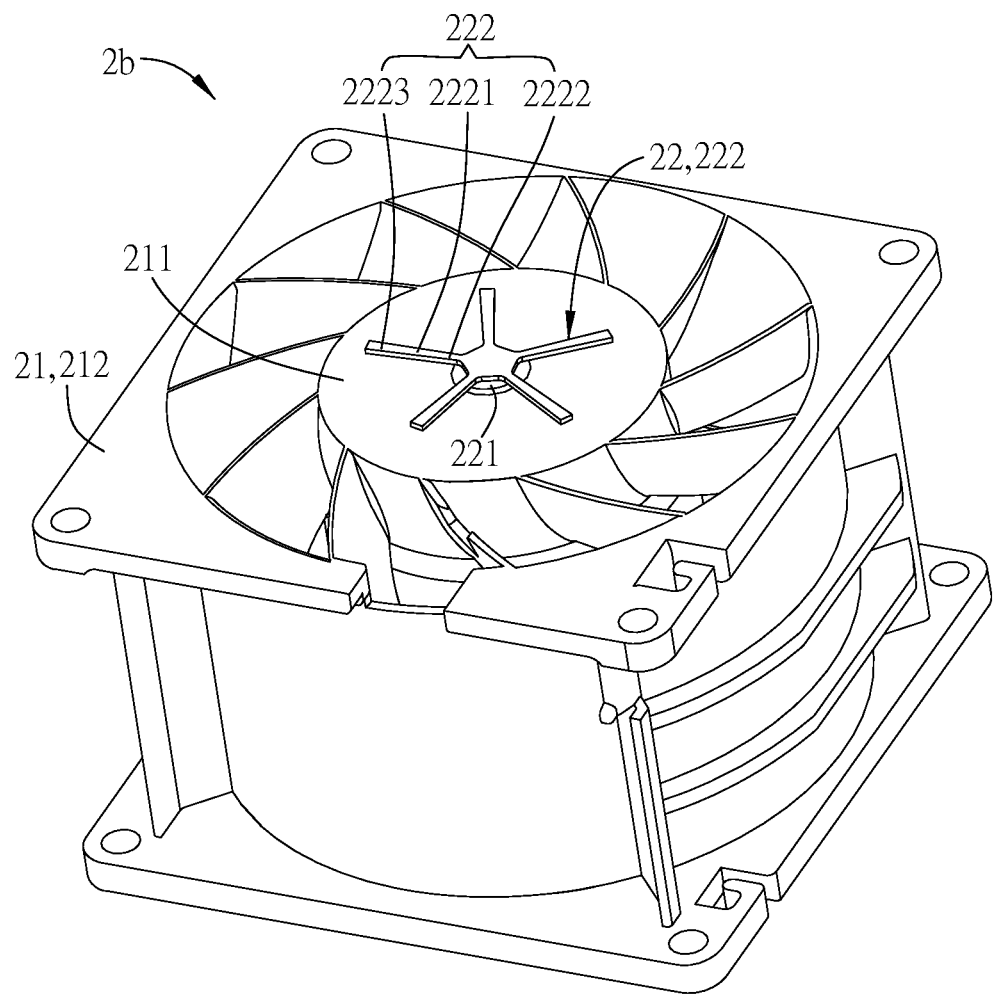
FIG. 2C is a schematic diagram showing a fan according to another embodiment of the disclosure, wherein the vibration absorbing structure of the frame structure is different from that shown in FIG. 2A.

The following embodiments will be described with reference to FIGS. 1A, 1B, 2A, 2B and 2C. FIG. 1A is a schematic diagram showing a frame structure according to an embodiment of the disclosure. FIG. 1B is a schematic diagram showing a frame structure according to another embodiment of the disclosure. FIG. 2A is a schematic diagram showing a fan according to an embodiment of the disclosure. FIG. 2B is a schematic diagram showing a fan according to another embodiment of the disclosure. FIG. 2C is a schematic diagram showing a fan according to another embodiment of the disclosure, wherein the vibration absorbing structure of the frame structure is different from that shown in FIG. 2A. In order to make the drawings more clear, the driving devices of the fans 2, 2a and 2b are not shown in FIGS. 2A to 2C.

This disclosure provides a frame structure 1, which includes a frame body 11 and at least one vibration absorbing structure 12. The vibration absorbing structure 12 includes a support column 121 and at least one cantilever 122. The cantilever 122 includes a cantilever body 1221, a first end portion 1222, and a second end portion 1223. One end of the support column 121 is connected to a wall surface of the frame body 11. The first end portion 1222 of the cantilever 122 is connected to the support column 121, and the cantilever body 1221 and the second end portion 1223 extend outwardly and swing freely on the wall surface of the frame body 11. When the cantilever body 1221 and the second end portion 1223 are swinging, the cantilever body 1221 and the second end portion 1223 are not in contact with a peripheral member and the frame structure 1. In this embodiment, the number of the cantilevers is two or more than two, and the cantilever do not contact with another one.

The disclosure further provides a fan 2 including an impeller 23, a driving device, a supporting element 21, and at least one vibration absorbing structure 22. The driving device drives the impeller 23 to rotate (not shown), and the supporting element 21 carries the driving device. The vibration absorbing structure 22 includes a support column 221 and at least one cantilever 222. The cantilever 222 includes a cantilever body 2221, a first end portion 2222, and a second end portion 2223. One end of the support column 221 is connected to a wall surface of the supporting element 21. The first end portion 2222 of the cantilever 222 is connected to the support column 221. The cantilever body 2221 and the second end portion 2223 extend outwardly and swing freely on the wall surface of the supporting element 21. When the cantilever body 2221 and the second end portion 2223 are swinging, the cantilever body 2221 and the second end portion 2223 are not in contact with a peripheral member and the supporting element 21. In this embodiment, the supporting element 21 further includes a base or a frame, and the vibration absorbing structure 22 is disposed on at least one wall surface of the base 211 (see FIG. 2C) or the frame 212 (see FIG. 2B).

As mentioned above, the vibration absorbing structure can be disposed on a part of the frame body or the supporting element, which can easily generate resonance. The vibration absorbing structure can be connected to the frame body or the supporting element by adhering, engaging, ejection molding, dual-ejection molding or the likes. The first end portion of the cantilever can be connected to the end portion or the middle of the support column. This configuration can ensure that the cantilever body and the second end portion are not in contact with a peripheral member and the supporting element when the cantilever body and the second end portion are swinging. In addition, the configuration of the support column can improve the swinging stability of the cantilever body and the second end portion, thereby increasing the vibration absorption effect. Herein, the periphery member includes the components disposed around the frame structure or the fan, such as the case, electronic device, circuit board, or power supplier. Besides, the cantilever body and the second end portion extend outwardly along at least one dimension with respect to the first end portion, and when the cantilever body and the second end portion are swinging, they are freely swinging in the at least one dimension.

The frame structure and the fan of this disclosure are configured with at least one vibration absorbing structure for absorbing the generated vibration. When the frame structure and the fan generate resonance, the cantilever body and the second end portion of the vibration absorbing structure can freely swing on the set structure without contacting to the periphery member during the swinging. The generated swing is a motion in a reverse phase of the set structure, so that the vibration can be released to the air. Accordingly, the absorbing structure can compensate and absorb the vibration of the structure, thereby achieving the effective damping effect.

In this embodiment, the support column 121 and the cantilever 122 or the support column 221 and the cantilever 222 can be structures made of the same or different materials. If they are made of different materials, the cantilever can be connected to the support column by ejection molding or engaging, and the cantilever can be fixed on the frame body or the supporting element. Since the support column and the cantilever are made of different materials, the resonance of the structure configured with the vibration absorbing structure can be effectively dissipated, and the vibration of the entire structure can be decreased.

Referring to FIG. 1B, when the wall surface of the frame body 11 of the frame structure 1a is thicker, the wall surface may have at least one accommodating space S1 sunk from at least one surface of the frame body 11, and the vibration absorbing structure 12 is disposed in the accommodating space S1. Referring to FIG. 2B, when the wall surface of the supporting element 21 of the fan 2a is thicker, the wall surface may have at least one accommodating space S2 sunk from at least one surface of the supporting element 21, and the vibration absorbing structure 22 is disposed in the accommodating space S2. In this embodiment, at least one surface of the frame body 11 of FIG. 1B has at least one accommodating space S1 sunk from at least one surface of the frame body 11. The vibration absorbing structure 12 is disposed in the accommodating space S1, and the end of the support column 121 is connected to the wall surface of the frame body 11. When the cantilever body 1221 and the second end portion 1223 are swinging, the cantilever body 1221 and the second end portion 1223 are not in contact with the wall surface of the frame body 11. To be noted, the vibration absorbing structure 12 of the frame structure 1 of FIG. 1A is disposed on and protruded from the surface of the frame body 11, and the vibration absorbing structure 12 of the frame structure 1a of FIG. 1B is disposed in the accommodating space S1 sunk from the wall surface of the frame body 11. Similarly, as shown in FIG. 2B, the supporting element 21 has at least one accommodating space S2 sunk from at least one surface of the supporting element 21. The vibration absorbing structure 22 is disposed in the accommodating space S2, and the end of the support column 221 is connected to the wall surface of the supporting element 21. When the cantilever body 2221 and the second end portion 2223 are swinging, the cantilever body 2221 and the second end portion 2223 are not in contact with the wall surface of the supporting element 21. In this embodiment, the supporting element 21 can be a base 211 (not shown) or a frame 212 of the fan 2a, and the vibration absorbing structure 22 is disposed in the accommodating space S2 sunk from the wall surface of the supporting element 21. To be noted, the vibration absorbing structure 22 of the fan 2 of FIG. 2A is disposed on and protruded from the surface of the supporting element 21, and the vibration absorbing structure 22 of the fan 2a of FIG. 2B is disposed in the accommodating space S2 sunk from the wall surface of the supporting element 21.

The configuration of the accommodating space can accommodate the vibration absorbing structure without increasing the volume of the frame body and the supporting element of the fan. Moreover, the surface of the structure configured with the vibration absorbing structure can be remain smooth and have a beautiful outward appearance, and the spatial configuration of the entire system is not influenced.

Figure 3A:
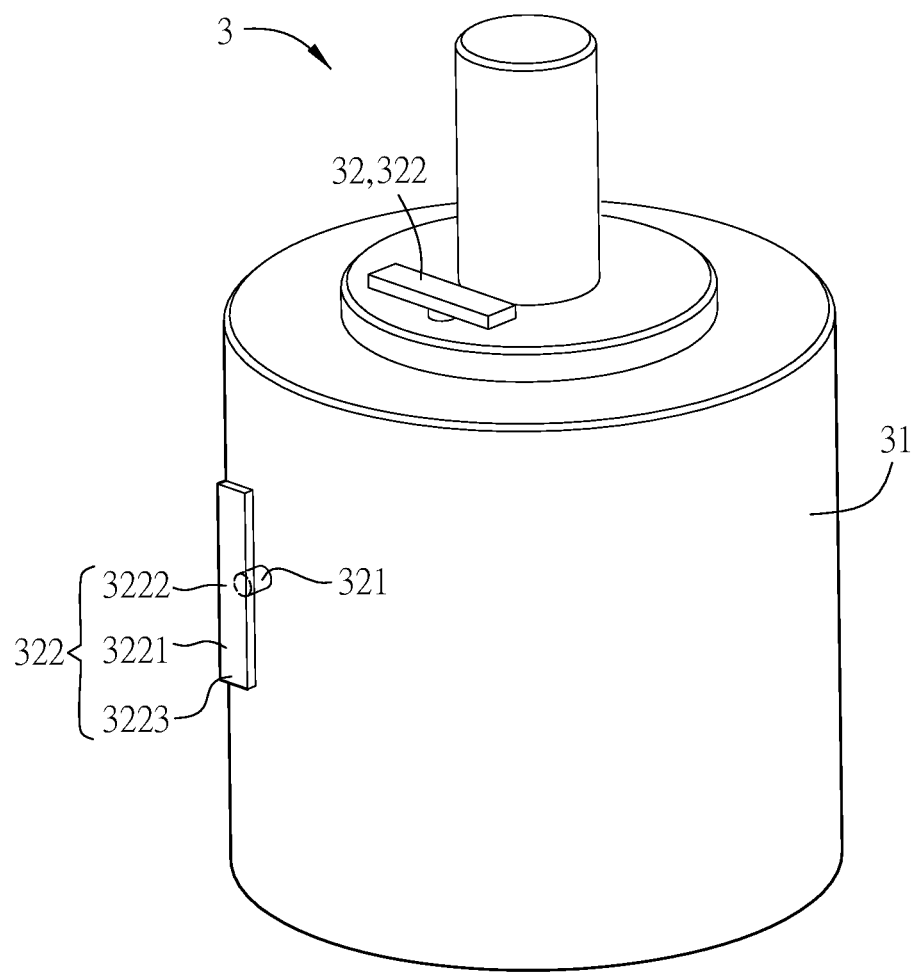
FIG. 3A is a schematic diagram showing a motor according to an embodiment of the disclosure.
Figure 3B:
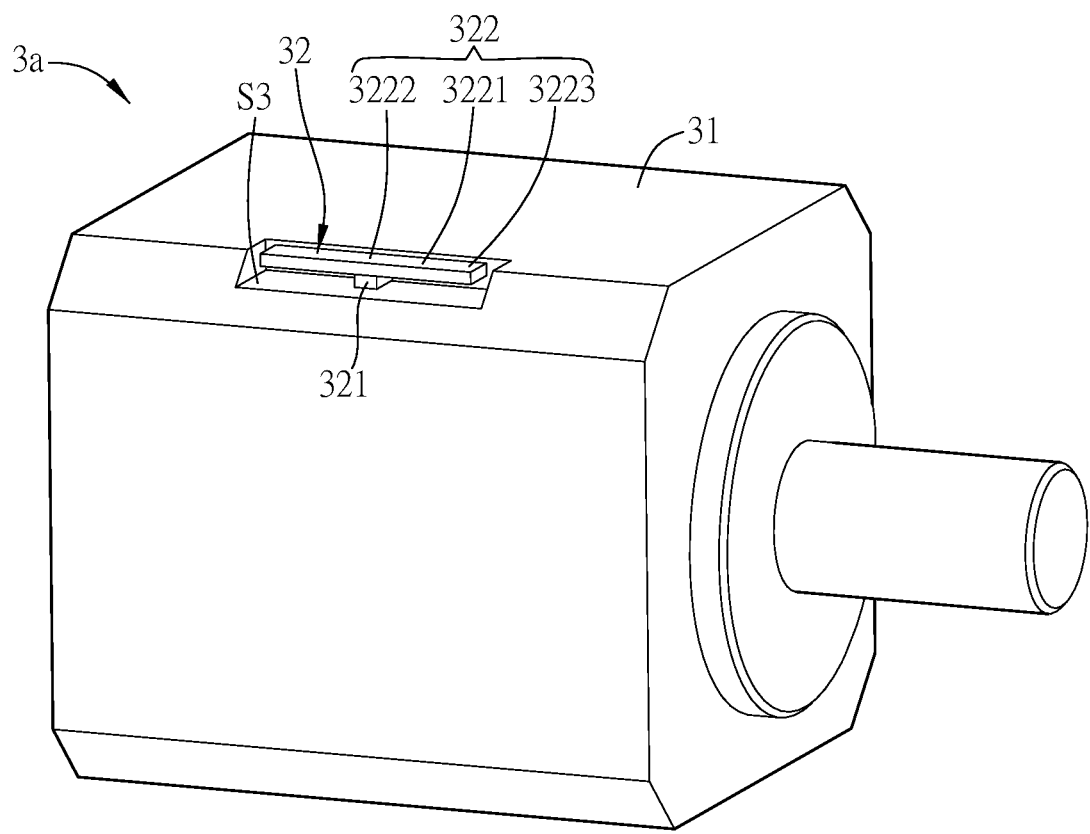
FIG. 3B is a schematic diagram showing a motor according to another embodiment of the disclosure.
Figure 4A:
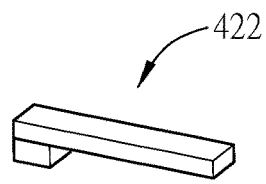
FIGS. 4A to 4J and 5A to 5D are schematic diagram showing different aspects of the vibration absorbing structure of this disclosure.
Figure 4F:
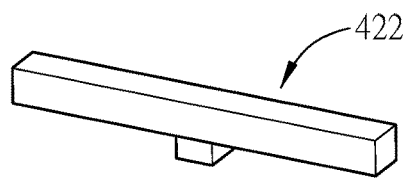
Figure 4B:
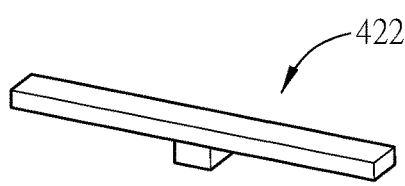
Figure 4G:
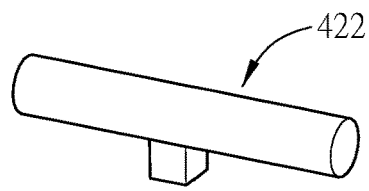
Figure 4C:
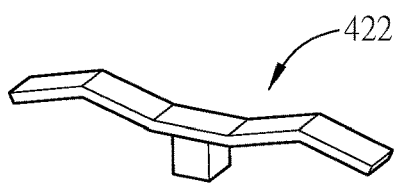
Figure 4H:
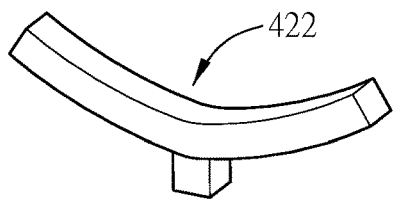
Figure 4D:
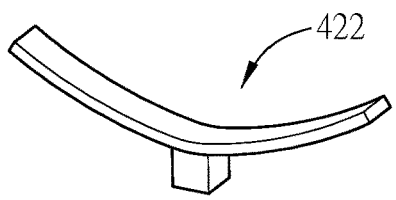
Figure 4I:
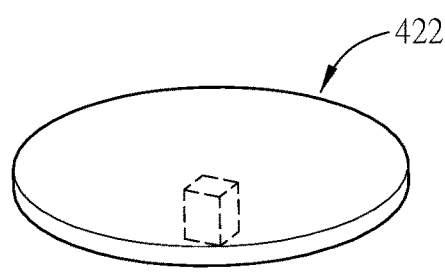
Figure 4E:
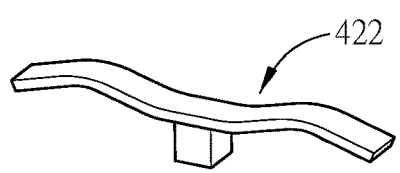
Figure 4J:
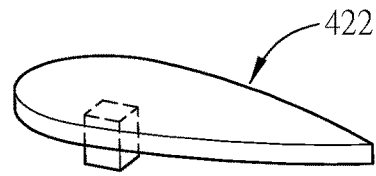

Reference to FIGS. 3A and 3B, this disclosure further provides a motor 3 including a driving device 33, a housing 31 and at least one vibration absorbing structure 32. The driving device 33 is disposed in the housing 31 (not shown). The vibration absorbing structure 32 includes a support column 321 and at least one cantilever 322. The cantilever 322 includes a cantilever body 3221, a first end portion 3222, and a second end portion 3223. One end of the support column 321 is connected to a wall surface of the housing 31. The first end portion 3222 of the cantilever 322 is connected to the support column 321. The cantilever body 3221 and the second end portion 3223 extend outwardly and swing freely on the wall surface of the housing 31. When the cantilever body 3221 and the second end portion 3223 are swinging, the cantilever body 3221 and the second end portion 3223 are not in contact with a peripheral member and the housing 31. In this embodiment, the peripheral member includes the components disposed around the motor, such as the case, electronic device, circuit board, power supplier, or the likes.

As mentioned above, the vibration absorbing structure can be disposed on a part of the motor, which can easily generate resonance. The connection method between the vibration absorbing structure and the motor housing, the configuration relationship between the first end portion of the cantilever and the support column, and the extension direction and swinging direction of the cantilever body and the second end portion are the same as those of the frame structure and the fan in the previous embodiments, so the detailed descriptions thereof will be omitted.

In this embodiment, the support column 321 and the cantilever 322 of the vibration absorbing structure 32 can be structures made of the same or different materials. If they are made of different materials, the cantilever 322 can be connected to the support column 321 by ejection molding or engaging, and the cantilever 322 can be fixed on the housing 31 of the motor 3. Since the support column 321 and the cantilever 322 are made of different materials, the resonance of the motor 3 can be effectively dissipated by the configured vibration absorbing structure, and the vibration of the entire motor 3 can be decreased.

Referring to FIG. 3B, when the wall surface of the housing 31 of the motor 3a is thicker, the wall surface may have at least one accommodating space S3 sunk from at least one surface of the housing 31, and the vibration absorbing structure 32 is disposed in the accommodating space S3. In this embodiment, at least one surface of the housing 31 of the motor 3a has at least one accommodating space S3 sunk from at least one surface of the housing 31. The vibration absorbing structure 32 is disposed in the accommodating space S3, and the end of the support column 321 is connected to the wall surface of the housing 31. When the cantilever body 3221 and the second end portion 3223 are swinging, the cantilever body 3221 and the second end portion 3223 are not in contact with the wall surface of the housing 31. The configuration of the accommodating space can accommodate the vibration absorbing structure without increasing the volume of the housing of the motor. Moreover, the surface of the motor configured with the vibration absorbing structure can be remain smooth and have a beautiful outward appearance, and the spatial configuration of the entire system is not influenced. Thus, the operations of the motor and the peripheral components are not influenced, too.

The shapes and modifications of the configurations of the vibration absorbing structure will be further described with reference to FIGS. 2C, 4A to 4J, and 5A to 5D.

Based on the design of the vibration absorbing structure in different shapes, the vibrations in some specific bandwidths can be eliminated. As shown in FIGS. 4A to 4J, the shape of the cantilever 422 can be a flat plate structure (see FIGS. 4A and 4B), a folded plate structure (see FIG. 4C), a curved plate structure (see FIG. 4D), a wavy plate structure (see FIG. 4E), a column structure (see FIGS. 4F and 4G), a curved column structure (see FIG. 4H), a circular disc structure (see FIG. 4I), a wing structure (see FIG. 4J), or an irregular structure (not shown). As mentioned above, the cantilever body and the second end portion of the cantilever extend along at least one dimension with respect to the first end portion. When the cantilever body and the second end portion are swinging, the cantilever body and the second end portion are freely swinging in the at least one dimension.

In addition, based on the configuration of the cantilever and the support column of the vibration absorbing structure, the vibrations in some specific bandwidths can be eliminated. In the fan 2b as shown in FIG. 2C, a single support column 221 of the vibration absorbing structure 22 can connect to a plurality of cantilevers 222 in one plane, and the cantilever bodies 2221 and the second end portions 2223 of the cantilevers 222 extend toward different directions. In this embodiment, when the vibration absorbing structure 22 includes a plurality of cantilevers 222 and the cantilever body 2221 and the second end portion 2223 of each cantilever 222 are swinging, the cantilever body 2221 and the second end portion 2223 of each cantilever 222 are not in contact with the cantilever bodies 2221 and the second end portions 2223 of other cantilevers 222. In this case, the other cantilevers includes the two cantilevers disposed at the upper and lower layers, the adjacent two cantilevers, or the distanced two cantilevers.

Figure 5A:
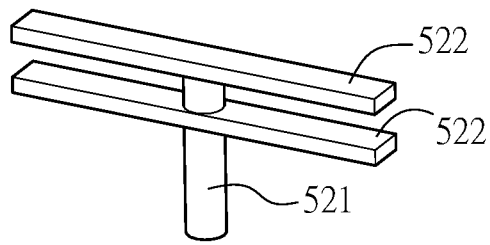
Figure 5B:
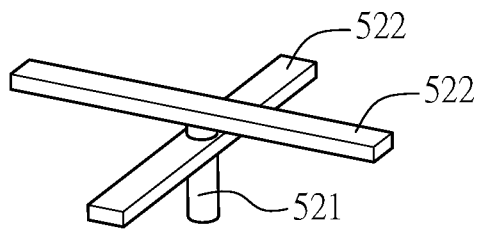
Figure 6:
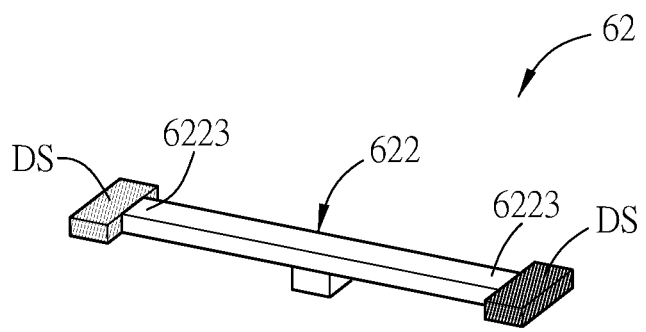
FIG. 6 is a schematic diagram showing another aspect of the cantilever of the vibration absorbing structure of the disclosure.

In addition, the above-mentioned cantilever can also be constructed by a plurality of sections, which are made of different materials. As shown in FIG. 6, each of two second end portions 6223 of the cantilever 622 of the vibration absorbing structure 62 can be configured with a hetero-material vibration absorbing structure DS. The hetero-material vibration absorbing structure DS also has an effect of adjusting the absorbed vibration frequency. In this embodiment, the hetero-material vibration absorbing structure DS can be connected to the second end portion 6223 by ejection molding or engaging. When the frame body or the housing of the motor generates resonance, the second end portion 6223 and hetero-material vibration absorbing structure DS of the vibration absorbing structure 62 can freely swing on the set structure, and are not in contact with the peripheral member during the swinging. Since the hetero-material vibration absorbing structure DS and the second end portion 6223 are made of different materials, the resonance of the frame body and the housing of the motor can be effectively dissipated by the vibration absorbing structure 62, and the vibration of the frame body or the housing of the motor can be decreased. As mentioned above, the first end portion of the cantilever can be connected to the end portion or middle of the support column, so that the single support column can be configured with dual layers or more layers of cantilevers. As shown in FIGS. 5A and 5B, the cantilever 522 is a dual layer structure, and each layer of cantilever 522 can extend toward the same or different direction with respect to the support column 521. When the cantilever body and the second end portion are swinging, the cantilever body and the second end portion are not in contact with the cantilever bodies and second end portions of other cantilevers, thereby ensuring that the swinging cantilever body and second end portion do not collide with the peripheral members. In addition, when the vibration absorbing structure includes multilayers of cantilevers, the design of the support column can improve the swing stability of the cantilever body and the second end portion so as to increase the damping effect.

Figure 5C:
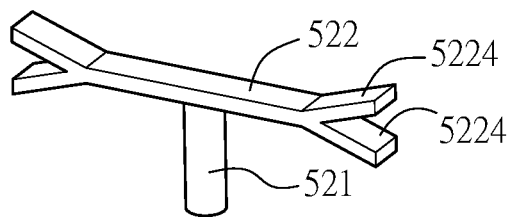
Figure 5D:
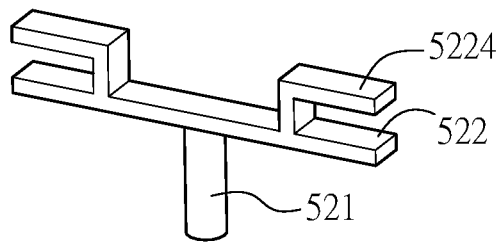

As shown in FIGS. 5C and 5D, in one embodiment, the cantilever 522 may further include at least one secondary arm 5224. One end of the secondary arm 5224 is connected to the cantilever 522, and the other end of the secondary arm 5224 extends outwardly. In this embodiment, the secondary arms can connect to each other or isolated with each other. The design of the secondary arm allows the vibration absorbing structure to compensate the resonance of more specific bandwidths.

As mentioned above, the frame structure, fan and motor of this disclosure are configured with at least one vibration absorbing structure for absorbing the generated vibration. When the frame structure, fan and motor generate resonance, the cantilever body and the second end of the vibration absorbing structure can swing freely on the set structure and are not in contact with the peripheral members. In this case, the generated swing is a motion in a reverse phase of the set structure for releasing the vibration to the air, so that the vibration absorbing structure can compensate and absorb the vibration of the structure, thereby achieving the effective damping effect.

When the wall surfaces of the frame body, the supporting element of the fan, and the housing of the motor are thicker, the vibration absorbing structure can be disposed in the accommodating space sunk from the surface of the structure without increasing the total volume of the entire set structure. This design of the vibration absorbing structure can keep the smooth surface of the set structure and make the outer appearance more beautiful, and does not influence the spatial configuration of the entire system, so that the operations of the fan, motor and peripheral members are not affected.

In addition, the configuration of the vibration structure can eliminate the vibration of a certain bandwidth. The shape and amount of the cantilevers and the secondary arms can increase the absorbed vibration bandwidth. The configuration of the support column can increase the diversity for setting the cantilevers and improve the motion stability of the cantilevers. These configurations can achieve an effective damping effect, increase the lifetime of the fan and motor, and enhance the performance of the entire system.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A fan, comprising:
an impeller;
a driving device driving the impeller to rotate;
a supporting element carrying the driving device; and
at least one vibration absorbing structure, wherein the at least one vibration absorbing structure comprises a support column and two or more than two cantilevers, each of the two or more than two cantilevers comprises a cantilever body, a first end portion and a second end portion, one end of the support column is connected to a wall surface of the supporting element, the first end portion of the cantilever is connected to the support column, the cantilever body and the second end portion extend outwardly and swing freely on the wall surface of the supporting element, and when the cantilever body and the second end portion are swinging, the cantilever body and the second end portion are not in contact with a peripheral member around the driving device and the supporting element,
wherein one of the two or more than two cantilevers does not contact with another one of the two or more than two cantilevers.

2. The fan according to claim 1, wherein the supporting element further comprises a base, and the vibration absorbing structure is disposed on at least one wall surface of the base.

3. The fan according to claim 1, wherein the supporting element further comprises a frame, and the at least one vibration absorbing structure is disposed on at least one wall surface of the frame.

4. The fan according to claim 1, wherein one of the two or more than two cantilevers is a flat plate structure, a folded plate structure, a curved plate structure, a wavy plate structure, a column structure, a curved column structure, a circular disc structure, or a wing structure.

5. The fan according to claim 1, wherein the support column and the two or more than two cantilevers are structures made of different materials.

6. The fan according to claim 1, wherein one of the two or more than two cantilevers further comprises at least one secondary arm, one end of the secondary arm is connected to the one of the two or more than two cantilevers, and the other end of the secondary arm extends outwardly.

7. The fan according to claim 1, wherein the supporting element has at least one accommodating space sunk from at least one surface of the supporting element, the vibration absorbing structure is disposed in the accommodating space, the one end of the support column is connected to the wall surface of the supporting element, and when the cantilever body and the second end portion are swinging, the cantilever body and the second end portion are not in contact with the wall surface of the supporting element.

* * * * *